(12) United States Patent
Lim

(10) Patent No.: US 8,349,737 B2
(45) Date of Patent: Jan. 8, 2013

(54) MANUFACTURING METHOD OF ARRAY SUBSTRATE USING LIFT-OFF METHOD

(75) Inventor: Jong-Ju Lim, Gumi-si (KR)

(73) Assignee: LG Display Co. Ltd., Seoul (KR)

( * ) Notice: Subject to any disclaimer, the term of this patent is extended or adjusted under 35 U.S.C. 154(b) by 926 days.

(21) Appl. No.: 11/319,306

(22) Filed: Dec. 27, 2005

(65) Prior Publication Data
US 2007/0004101 A1 Jan. 4, 2007

(30) Foreign Application Priority Data

Jun. 30, 2005 (KR) .............................. 2005-0057899

(51) Int. Cl.
*H01L 21/44* (2006.01)
(52) U.S. Cl. ................. 438/670; 438/951; 257/E21.587
(58) Field of Classification Search .................... 216/40; 438/670, 951, 159; 257/E21.587, E21.025
See application file for complete search history.

(56) References Cited

U.S. PATENT DOCUMENTS

| | | | | |
|---|---|---|---|---|
| 4,519,872 | A * | 5/1985 | Anderson et al. | 438/623 |
| 4,539,222 | A * | 9/1985 | Anderson et al. | 438/754 |
| 7,858,412 | B2 * | 12/2010 | Kim et al. | 438/30 |
| 2004/0126917 | A1 * | 7/2004 | Yoo et al. | 438/30 |
| 2004/0129943 | A1 * | 7/2004 | Yoo et al. | 257/72 |
| 2005/0024439 | A1 * | 2/2005 | Fukunaga et al. | 347/55 |
| 2005/0170628 | A1 * | 8/2005 | Sharma et al. | 438/612 |

FOREIGN PATENT DOCUMENTS

| | | |
|---|---|---|
| JP | 04-330727 | 11/1992 |
| KR | 10-0556701 | 4/2005 |
| KR | 10-0556702 | 4/2005 |

OTHER PUBLICATIONS

Office Action issued in corresponding Korean Patent Application No. 10-2005-0057899; issued Apr. 3, 2009.

* cited by examiner

*Primary Examiner* — Matthew Landau
*Assistant Examiner* — Daniel Luke
(74) *Attorney, Agent, or Firm* — Brinks Hofer Gilson & Lione

(57) ABSTRACT

A method of forming a pattern includes forming a photoresist pattern on a substrate, forming a first material layer on substantially an entire surface of the substrate including the photoresist pattern, heat-treating the substrate including the first material layer and the photoresist pattern, and forming the pattern by removing the photoresist pattern and the portion of the first material layer on the photoresist pattern. A method of manufacturing an array substrate includes forming a pixel region bounded by gate and data lines, and a thin film transistor; an insulating layer is selectively removed to form a passivation layer using a photoresist pattern as an etching mask; a transparent conductive layer is formed on substantially the entire substrate, and the substrate is heat treated. The photoresist pattern and the portion of the transparent conductive layer on the photoresist pattern are removed by a stripping material.

10 Claims, 13 Drawing Sheets

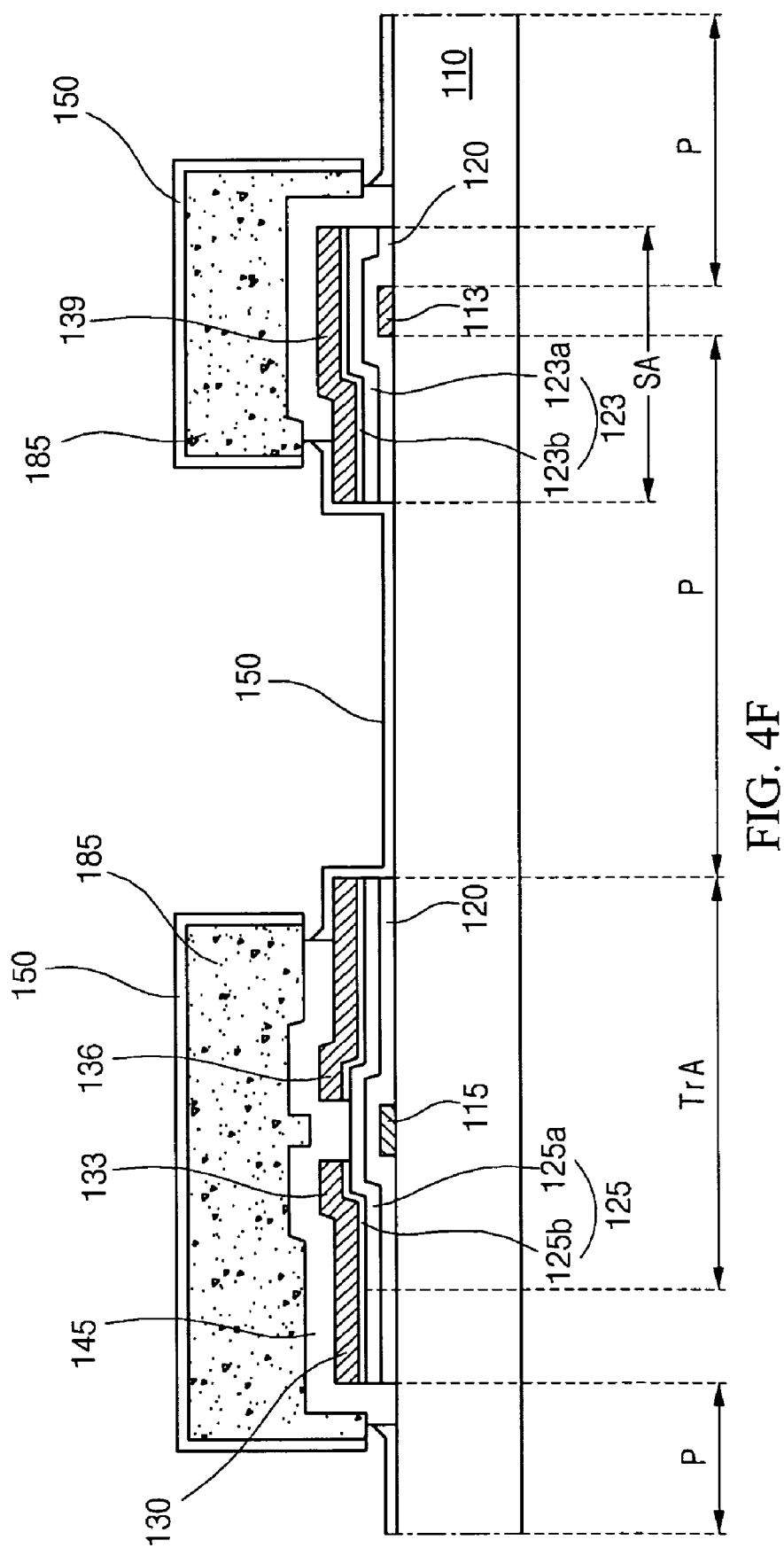

MANUFACTURING METHOD OF ARRAY SUBSTRATE USING LIFT-OFF METHOD

This application claims the benefit of Korean Patent Application No. 2005-0057899 filed on Jun. 30, 2005, which is hereby incorporated by reference for all purposes as if fully set forth herein.

TECHNICAL FIELD

The present application relates to a liquid crystal display (LCD) device and more particularly, to a method of manufacturing an array substrate for the liquid crystal display device using a lift-off method.

BACKGROUND

Display devices have evolved to process and display increasingly large amounts of information. Flat panel display technologies have been recently conceived and developed for display devices having small thickness, light weight, and low power consumption. Among these technologies, the liquid crystal display (LCD) device is already widely used for notebook computers, desktop monitors, and other application because of its superior resolution, color image display, and image quality.

Of the different types of known liquid crystal displays (LCD) and active matrix LCD (AM-LCD), which have thin film transistors (TFT) and pixel electrodes arranged in a matrix form, are the subject of significant research and development because of their high resolution and superior ability in displaying moving images.

An LCD device includes an upper substrate, a lower substrate, and a liquid crystal layer interposed between the upper and lower substrates. The LCD device uses an optical anisotropy of a liquid crystal material and produces an image by varying the transmittance of light according to the arrangement of liquid crystal molecules by an electric field.

The lower substrate includes thin film transistors and pixel electrodes. The lower substrate is fabricated through repeated photolithography processes to pattern a previously formed thin film. The upper substrate, which is usually referred to as a color filter substrate, includes a color filter layer for displaying color images. The color filter layer commonly includes color filter patterns of red (R), green (G), and blue (B).

FIG. 1 is an exploded perspective view illustrating a liquid crystal display (LCD) device. The LCD device has first and second substrates 12 and 22, which are spaced apart from and facing each other, and also has a liquid crystal layer 30 interposed between the first and second substrates 12 and 22.

At least one gate line 14 and at least one data line 16 are formed on the inner surface of the first substrate 12 (i.e., the side facing the second substrate 22). The gate line 14 and the data line 16 cross each other to define a pixel region P. A thin film transistor T, as a switching element, is formed at the crossing portion of the gate line 14 and the data line 16. A plurality of such thin film transistors is arranged in a matrix form to correspond to other crossing portions of gate and data lines. A pixel electrode 18, which is connected to the thin film transistor T, is formed in the pixel region P. The first substrate 12, which includes the thin film transistors T and the pixel electrodes 18 arranged in the matrix form, may be commonly referred to as an array substrate.

A black matrix 25 is formed on the inner surface of the second substrate 22 (i.e., the side facing the first substrate 12). The black matrix 25 has openings corresponding to respective pixel regions P and has a lattice shape surrounding each pixel region P. The black matrix 25 covers the gate line 14, the data line 16 and the thin film transistor T. A color filter layer 26 is formed in each opening of the black matrix 25 and includes three color filters of red (R) 26a, green (G) 26b, and blue (B) 26c sequentially arranged. Each color filter corresponds to the pixel region P. A common electrode 28 is formed on an entire surface of the second substrate 22 including the black matrix 25 and the color filter layer 26 and is transparent. The second substrate 22, which includes the black matrix 25, the color filter layer 26 and the common electrode 28, may be commonly referred to as a color filter substrate.

Although not shown in the figure, a sealant is formed along a peripheral region between the first and second substrates 12 and 22 to prevent the liquid crystal layer 30 from leaking. In addition, alignment layers are formed on top surfaces of the first and second substrates 12 and 22 adjacent to the liquid crystal layer 30 and control initial arrangement of liquid crystal molecules of the liquid crystal layer 30. A polarizer is disposed on at least one outer surface of the first substrate 12 and the second substrate 22.

Furthermore, a backlight unit is disposed over the outer surface of the first substrate 12 and provides light.

In operation, when a scanning pulse is applied to the thin film transistor T through the gate line 14 and the thin film transistor T turns on, a data signal from the data line 16 is provided to the pixel electrode 18 through the thin film transistor T. Then, the liquid crystal molecules of the liquid crystal layer 30 are driven and arranged by an electric field induced between the pixel electrode 18 and the common electrode 28. Thus, various images are produced according to varying transmittance of the light by the arrangements of the liquid crystal molecules.

FIG. 2 is a cross-sectional view illustrating a pixel region of an array substrate for an LCD device. A gate electrode 42 and a gate line (not shown) are formed on a substrate 40. A gate insulating layer 45 is formed on an entire surface of the substrate 40 including the gate electrode 42. A semiconductor layer 48 is formed on the gate insulating layer 45 over the gate electrode 42. The semiconductor layer 48 includes an active layer 48a and an ohmic contact layer 48b.

A source electrode 50, a drain electrode 52, and a data line (not shown) are formed on the ohmic contact layer 48b. The data line crosses the gate line to define a pixel region P. The source electrode 50 and the drain electrode 52 are spaced apart from each other over the gate electrode 42.

A passivation layer 55 is formed on an entire surface of the substrate 40 including the source and drain electrodes 50 and 52. The passivation layer 55 has a drain contact hole 57 exposing the drain electrode 52. A pixel electrode 59 is formed on the passivation layer 55 in the pixel region P. The pixel electrode 59 is connected to the drain electrode 52 through the drain contact hole 57.

The array substrate is manufactured through a photolithographic process using a mask, which may be referred to as a mask process.

More particularly, a first metallic material is deposited on the substrate 40 and then patterned through a first mask process to thereby form the gate electrode 40 and the gate line. Next, a first insulating material, intrinsic amorphous silicon (a-Si), and impurity-doped amorphous silicon ($n^+$ a-Si) are sequentially deposited, and the deposited intrinsic amorphous silicon and the deposited impurity-doped amorphous silicon are patterned through a second mask process to thereby form the semiconductor layer 48, which includes the active layer 48a and the ohmic contact layer 48b. The deposited first insulating material functions as the gate insulating layer 45. A second metallic material is deposited and then patterned through a third mask process to thereby form the data line, the source electrode 50 and the drain electrode 52. At this time, the ohmic contact layer 48b between the source and drain electrodes 50 and 52 is removed to thereby expose the active layer 48. The gate electrode 42, the semiconductor layer 48, and the source and drain electrodes 50 and 52 constitute a thin film transistor. The exposed active layer 48 acts as a channel of the thin film transistor. Then, a second insulating material is deposited and then is patterned through a fourth mask process to thereby form the passivation layer 55 having the drain contact hole 57 exposing a part of the drain electrode 52. A transparent conductive material is deposited on the passivation layer 55 and then is patterned through a fifth mask process to thereby form the pixel electrode 59.

Each mask process includes several steps of cleaning, coating a photoresist layer, exposing through a mask, developing the photoresist layer, and etching. To reduce the number of processes, a diffraction exposure method or a halftone exposure method has been proposed and developed, and, recently, a lift-off method has been suggested.

In the lift-off method, a photoresist pattern is formed, and a certain pattern is formed by using the photoresist pattern as an etching mask. Then, a material layer is formed on an entire surface of a substrate including the photoresist pattern, and the photoresist pattern is removed. At this time, a portion of the material layer on the photoresist pattern is also removed, and thus an expected pattern is formed. FIG. 3A and FIG. 3B are cross-sectional views illustrating a lift-off method for forming a pixel electrode according to the related art. In FIG. 3A, a gate electrode 63 is formed on a substrate 61 including a thin film transistor region TrA and a pixel region P. A gate insulating layer 65 is formed on the gate electrode 63. A semiconductor layer 67 including an active layer 67a and an ohmic contact layer 67b is formed on the gate insulating layer 65 over the gate electrode 63. Source and drain electrodes 70 and 72 are formed on the semiconductor layer 67. The gate electrode 63, the semiconductor layer 67, and the source and drain electrodes 70 and 72 constitute a thin film transistor Tr. These elements are formed through the same processes as the above-mentioned array substrate, which may be manufactured through five-mask processes. An inorganic insulating layer is formed on the substrate 61 including the thin film transistor Tr, and a photoresist layer is formed on the inorganic insulating layer.

The photoresist layer is exposed to light through a mask and is developed to thereby form a photoresist pattern 91. The photoresist pattern 91 covers the thin film transistor Tr and exposes a part of the drain electrode 72. Although not shown in the figure, the photoresist pattern 91 also covers a gate line and a data line. The inorganic insulating layer is patterned by using the photoresist pattern 91 as an etching mask to thereby form a passivation layer 77. The passivation layer 77 covers the thin film transistor Tr, the gate line and the data line and exposes the part of the drain electrode 72 and a part of the gate insulating layer 65. The passivation layer 77 is over-etched, and thus there exists an under cut structure that an edge of the passivation layer 77 is disposed inside an edge of the photoresist pattern 91. The exposed gate insulating layer 65 may be removed, and thus the substrate 61 may be exposed.

A transparent conductive material layer 80 is formed on an entire surface of the substrate 61 including the passivation layer 77 and the photoresist pattern 91. The transparent conductive material layer 80 is disconnected around the edges CA of the passivation layer 77 and the photoresist pattern 91 due to the under cut structure. Additionally, a lower surface of the photoresist pattern 91 adjacent to the edge of the passivation layer 77 is exposed, and thus a stripper for removing the photoresist pattern 91 can permeate into an interface between the passivation layer 77 and the photoresist pattern 91 through the exposed lower surface of the photoresist pattern 91.

In FIG. 3B, the substrate 61 including the transparent conductive material layer 80 is exposed to a stripper, and the stripper permeates into the interface between the passivation layer 77 and the photoresist pattern 91 around the under cut structure. The photoresist pattern 91 is removed with a portion of the transparent conductive material layer 80 on the photoresist pattern 91, and the transparent conductive material layer remains in the pixel region P. The remaining transparent conductive material layer functions as a pixel electrode 82.

However, in the lift-off method of the related art, since a portion of the photoresist pattern contacting the stripper, that is, an exposed surface of the photoresist pattern due to the under cut structure, is very small, it takes a long time to remove the photoresist pattern: for example, more than eight minutes. Therefore, productivity is lowered. Meanwhile, if the substrate is exposed to the stripper material for too much time or a temperature of the stripper is high in order to increase a speed of the process, the source and drain electrodes as well as the photoresist pattern may be removed or damaged. Accordingly, the pixel electrode may poorly contact the drain electrode or may be disconnected to the drain electrode.

SUMMARY

A method of forming a pattern includes forming a photoresist pattern on a substrate, forming a first material layer on substantially an entire surface of the substrate including the photoresist pattern, heat-treating the substrate including the first material layer and the photoresist pattern, and forming the pattern by removing the photoresist pattern and a portion of the first material layer on the photoresist pattern.

In another aspect, a method of manufacturing an array substrate includes forming a gate electrode and a gate line on a substrate, forming a gate insulating layer on the gate electrode and the gate line, forming an active layer and an ohmic contact layer on the gate insulating layer, forming source and drain electrodes on the ohmic contact layer and a data line on the gate insulating layer, the data line crossing the gate line to define a pixel region, forming an insulating layer on substantially an entire surface of the substrate including the source and drain electrodes and the data line, forming a photoresist pattern on the insulating layer, forming a passivation layer by selectively removing the insulating layer using the photoresist pattern as an etching mask, forming a transparent conductive layer on substantially an entire surface of the substrate including the passivation layer, heat-treating the substrate including the transparent conductive layer and the photoresist pattern, and forming a pixel electrode by removing the photoresist pattern and a portion of the transparent conductive layer on the photoresist pattern.

BRIEF DESCRIPTION OF THE DRAWINGS

FIG. 4A to FIG. 4H are cross-sectional views illustrating a manufacturing method of an array substrate for an LCD device;

DETAILED DESCRIPTION

Exemplary embodiments may be better understood with reference to the drawings, but these embodiments are not intended to be of a limiting nature. Like numbered elements in the same or different drawings perform equivalent functions.

Figure 1:
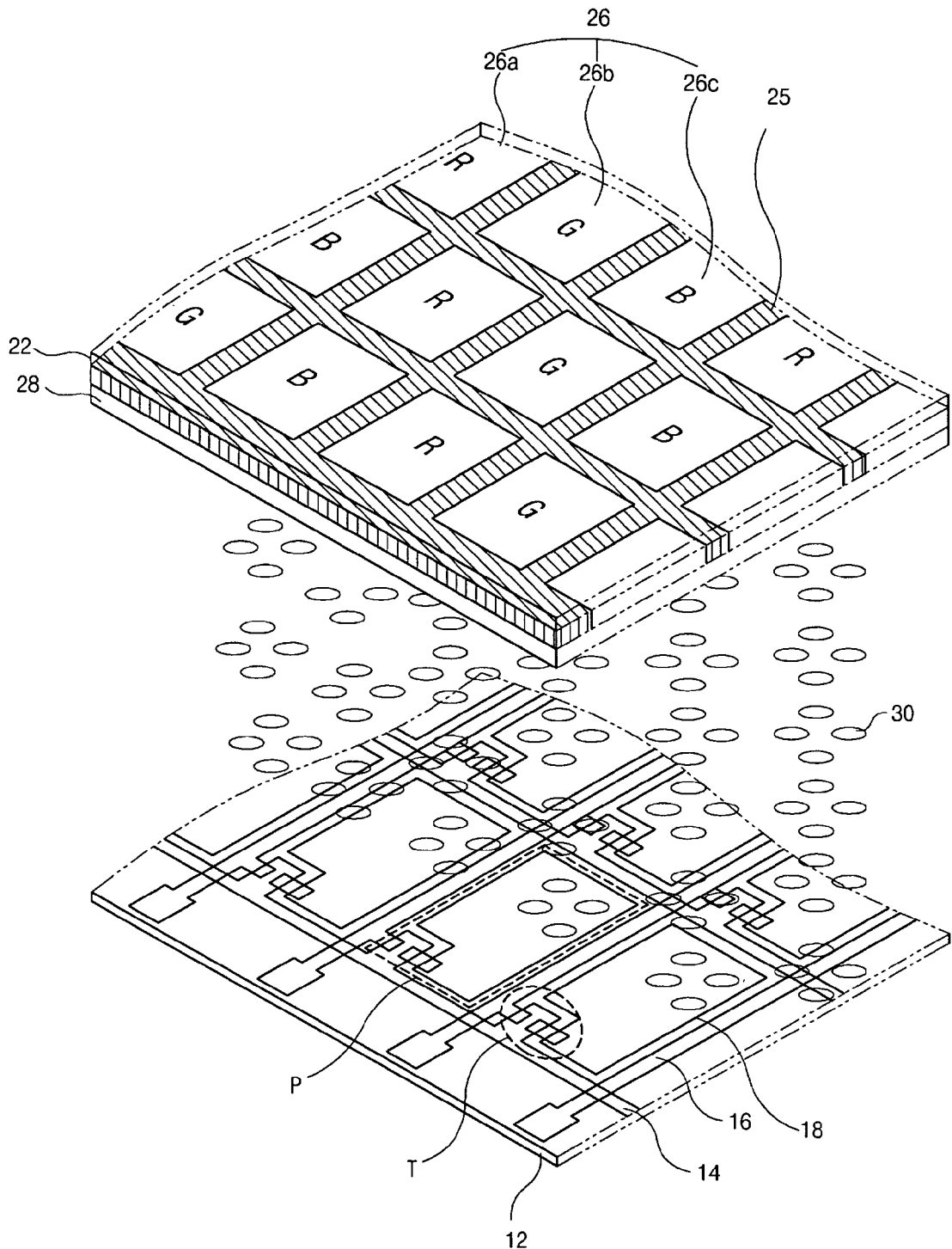
FIG. 1 is an exploded perspective view illustrating a related art liquid crystal display (LCD) device.
Figure 2:
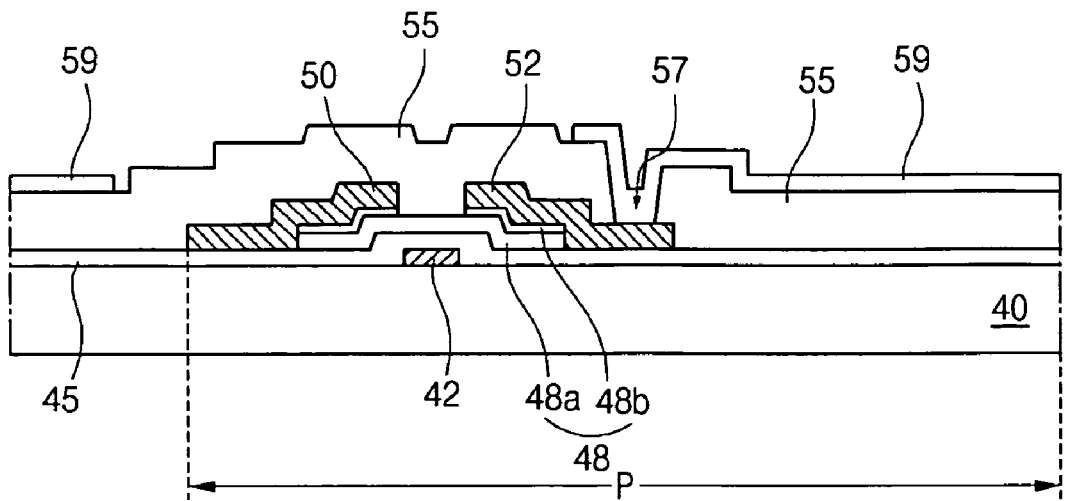
FIG. 2 is a cross-sectional view illustrating a pixel region of an array substrate for an LCD device according to the related art.
Figure 3A:
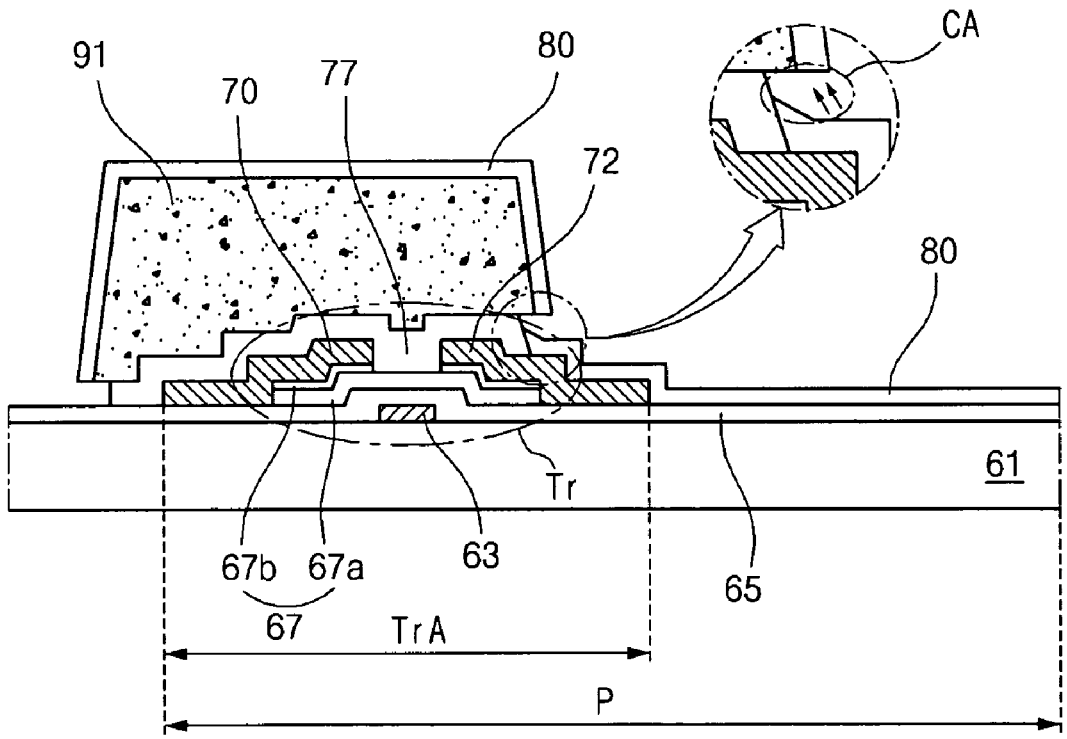
FIG. 3A and FIG. 3B are cross-sectional views illustrating a lift-off method for forming a pixel electrode according to the related art.
Figure 3B:
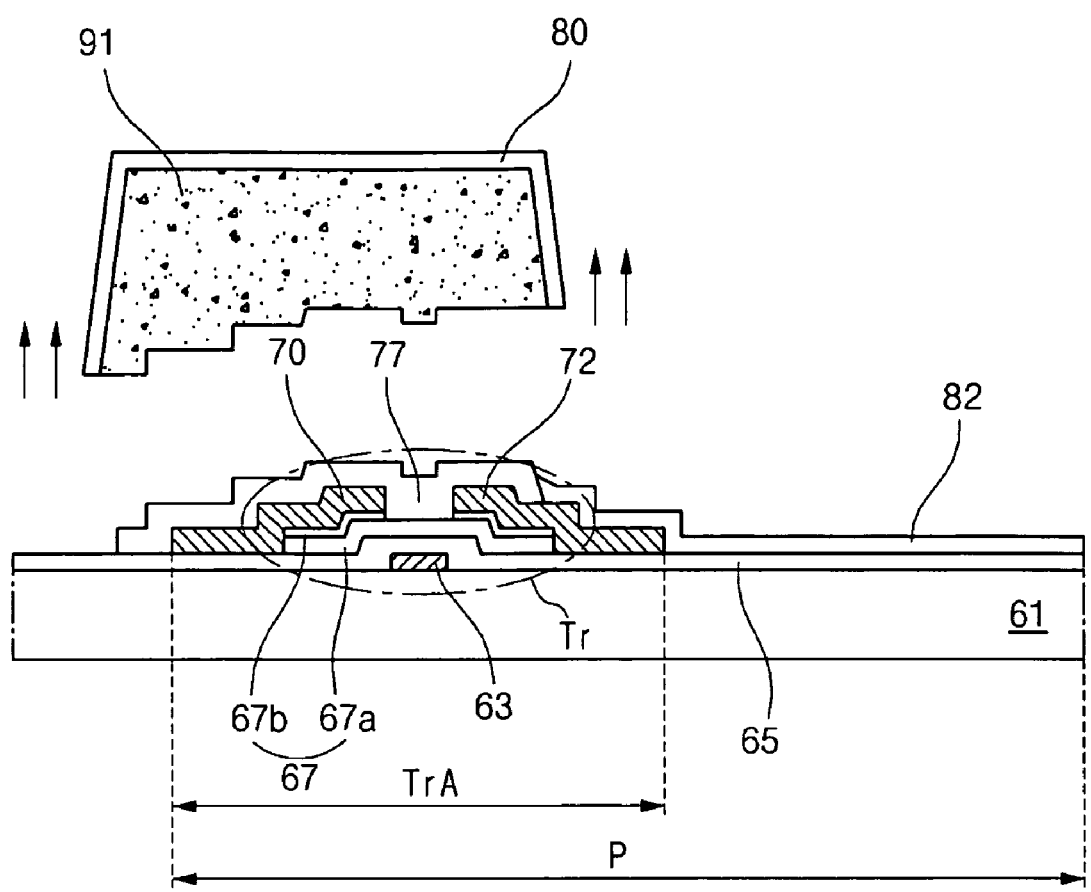
Figure 4A:
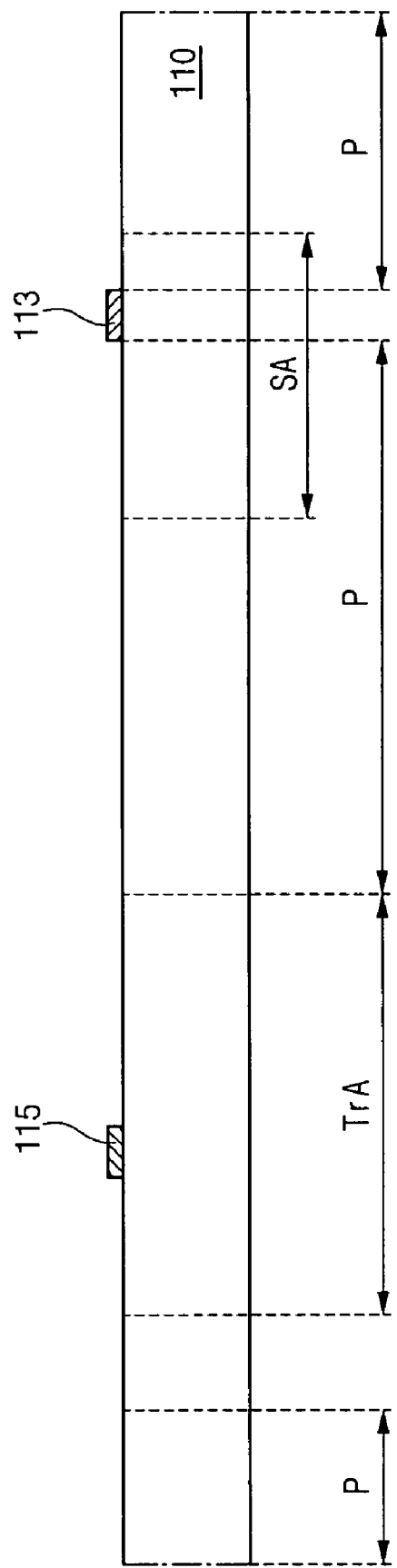

In FIG. 4A, a pixel region P, a storage region SA, and a switching region TrA are defined on a substrate 110, and a gate line 113 and a gate electrode 115 are formed on the substrate 110 through a first mask process. More particularly, a first metallic layer is formed on the substrate 110 by depositing a metallic material. A first photoresist layer is formed on the first metallic layer by coating photoresist and is exposed to light through a mask, which includes a transmitting portion and a blocking portion. The light-exposed first photoresist layer is developed, and thus a first photoresist pattern is formed. The first metallic layer is patterned by using the first photoresist pattern as an etching mask to thereby form the gate line 113 and the gate electrode 115. The gate electrode 115 is connected to the gate line 113 and is disposed in the switching region TrA.

Figure 4B:
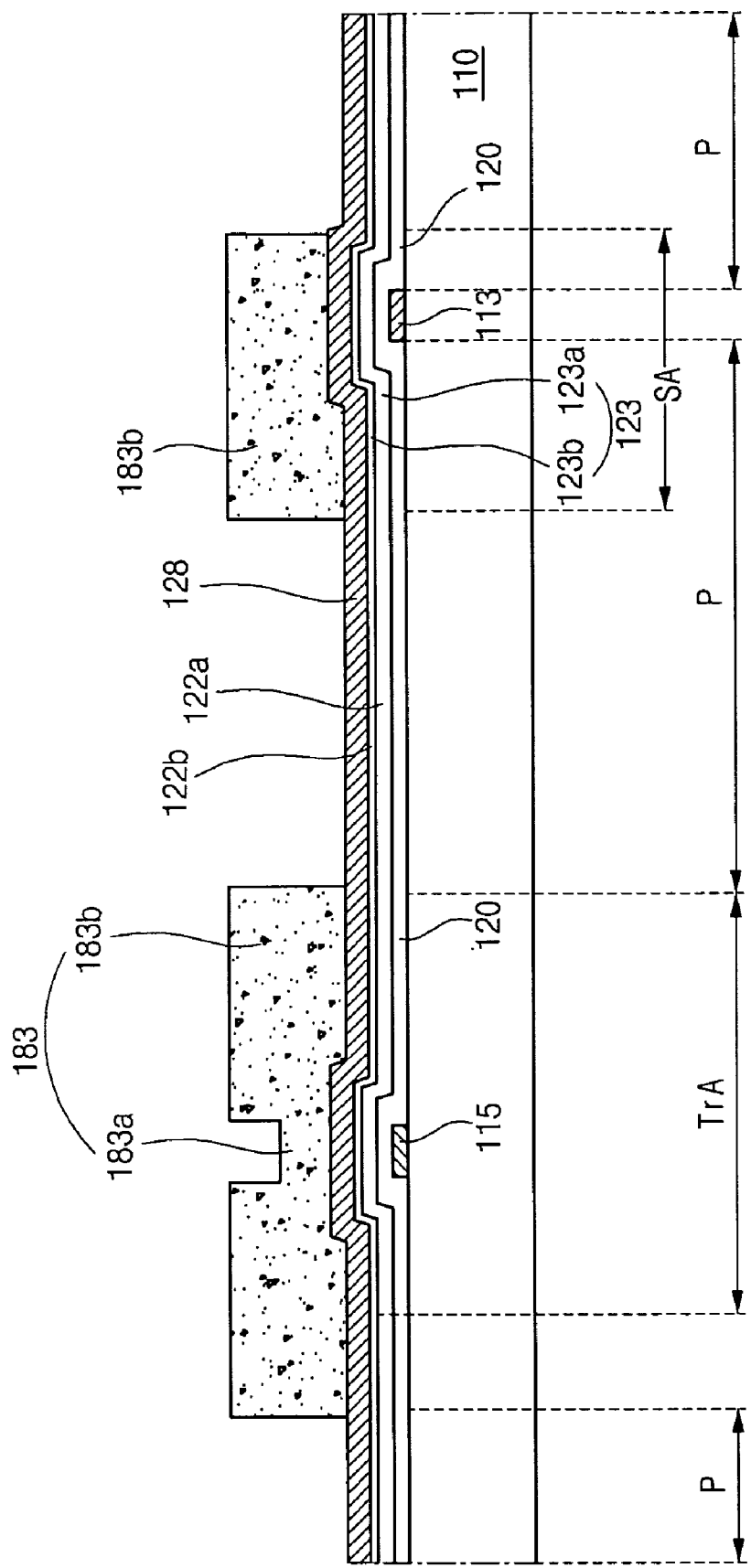
Figure 4C:
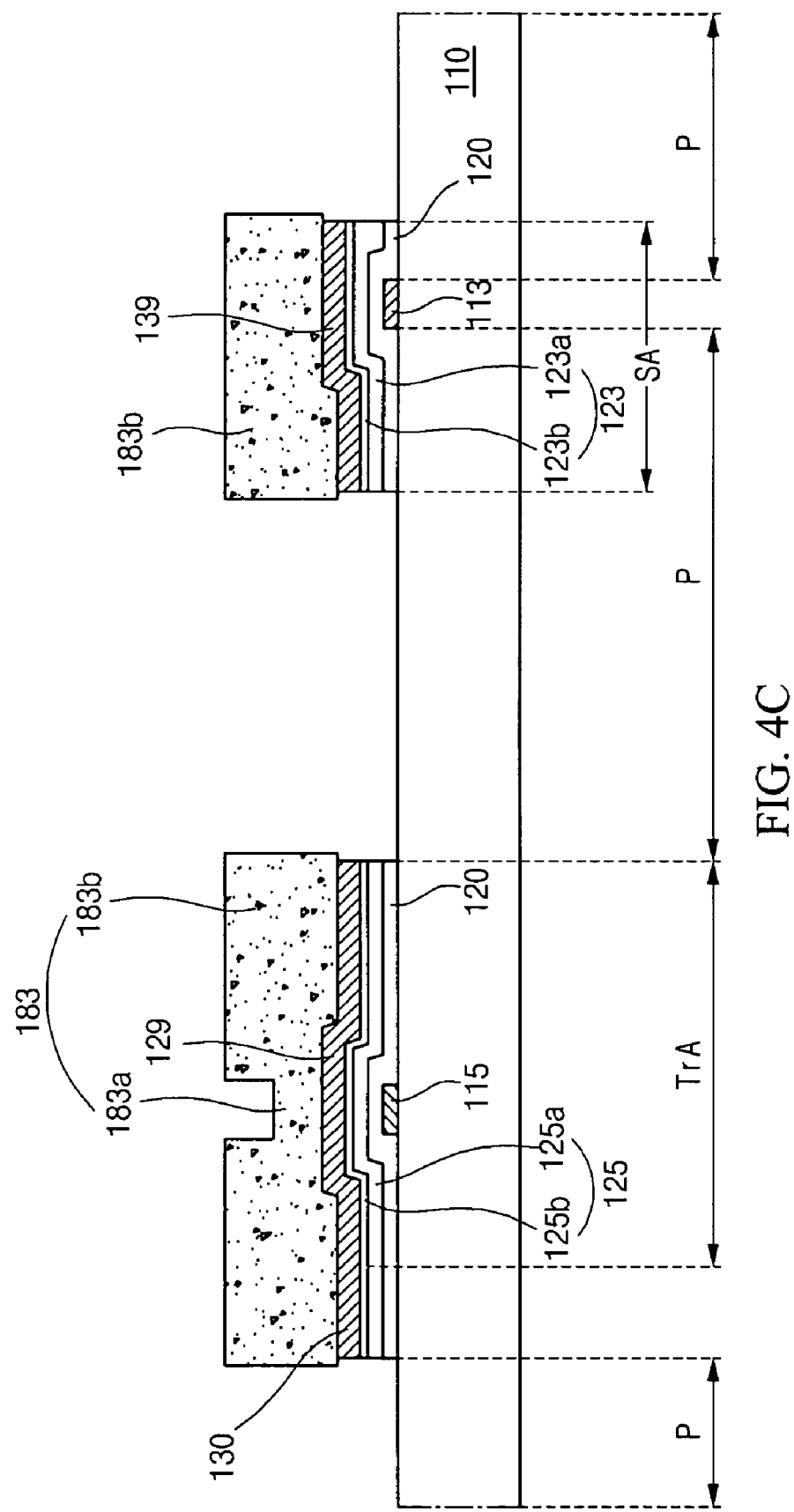
Figure 4D:
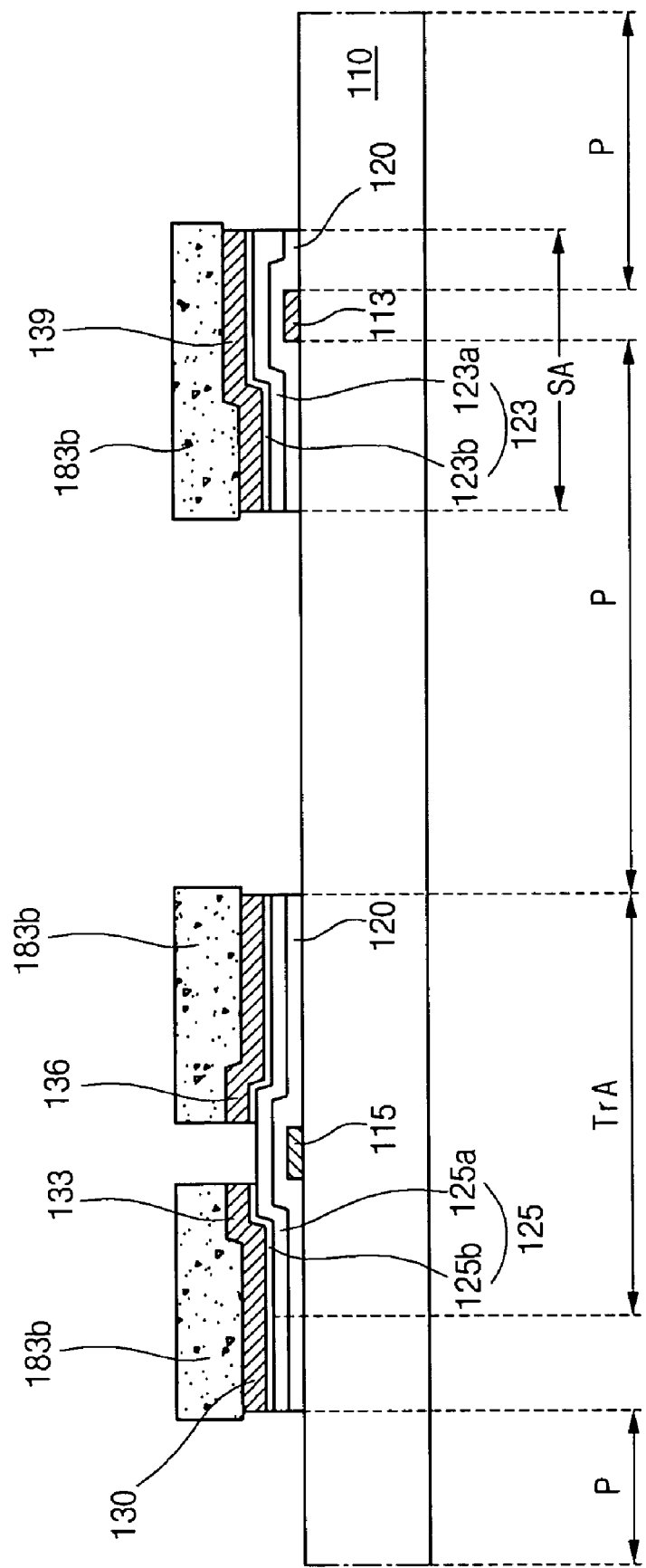

A second mask process is shown in FIG. 4B to FIG. 4D. In FIG. 4B, a gate insulating layer 120, an intrinsic amorphous silicon layer 122a, and an impurity-doped amorphous silicon layer 122b are sequentially formed on substantially an entire surface of the substrate 110 including the gate line 113 and the gate electrode 115, and then a second metallic layer 128 is formed on the impurity-doped amorphous silicon layer 122b. The gate insulating layer 120 is formed by depositing inorganic insulating materials such as silicon oxide ($SiO_2$) or silicon nitride ($SiN_x$).

A second photoresist layer is formed on the second metallic layer 128 by coating photoresist, and a mask (not shown) including a transmitting portion, a blocking portion and a half-transmitting portion is disposed over the second photoresist layer. The half-transmitting portion transmits light at a transmittance selected within a range of 0% to 100%. The second photoresist layer is exposed to light through the mask and is developed to thereby form a second photoresist pattern 183. The second photoresist pattern 183 includes a first portion 183a corresponding to the gate electrode 115 and second portions 183b corresponding to source and drain electrodes and a storage electrode to be formed later. The first portion 183a has a first thickness, and the second portions 183b have a second thickness thicker than the first thickness.

In FIG. 4C, the second metallic layer 128 of FIG. 4B, the impurity-doped amorphous silicon layer 122b of FIG. 4B, the intrinsic amorphous silicon layer 122a of FIG. 4B, and the gate insulating layer 120 are sequentially etched by using the second photoresist pattern 183 as an etching mask. Thus, a source and drain pattern 129 and a first semiconductor pattern 125 are formed in the switching region TrA, and a storage electrode 139 and a second semiconductor pattern 123 are formed in the storage region SA. At this time, a data line 130 connected to the source and drain pattern 129 is also formed. The data line 130 crosses the gate line 113 to define the pixel region P. Additionally, the substrate 110 is exposed in the pixel region P. The first semiconductor pattern 125 includes an active layer 125a of intrinsic amorphous silicon and an ohmic contact layer 125b of impurity-doped amorphous silicon. The second semiconductor pattern 123 also includes an intrinsic amorphous silicon pattern 123a and an impurity-doped amorphous silicon pattern 123b.

In FIG. 4D, the first portion 183a of FIG. 4C of the second photoresist pattern 183 is removed through an ashing process or a dry etching process to thereby expose a part of the source and drain pattern 129 of FIG. 4C. The second portion 183b of the second photoresist pattern 183 also is partially removed, so that the thickness of the second portion 183b is reduced. The exposed part of the source and drain pattern 129 of FIG. 4C is removed by using the second portion 183b of the second photoresist pattern 183 as an etching mask to thereby form source and drain electrodes 133 and 136. Then, the ohmic contact layer 125b exposed between the source and drain electrodes 133 and 136 is removed, and thus the active layer 125a is exposed. The second portion 183b of the second photoresist pattern is removed through an ashing process or a stripping process.

Figure 4E:
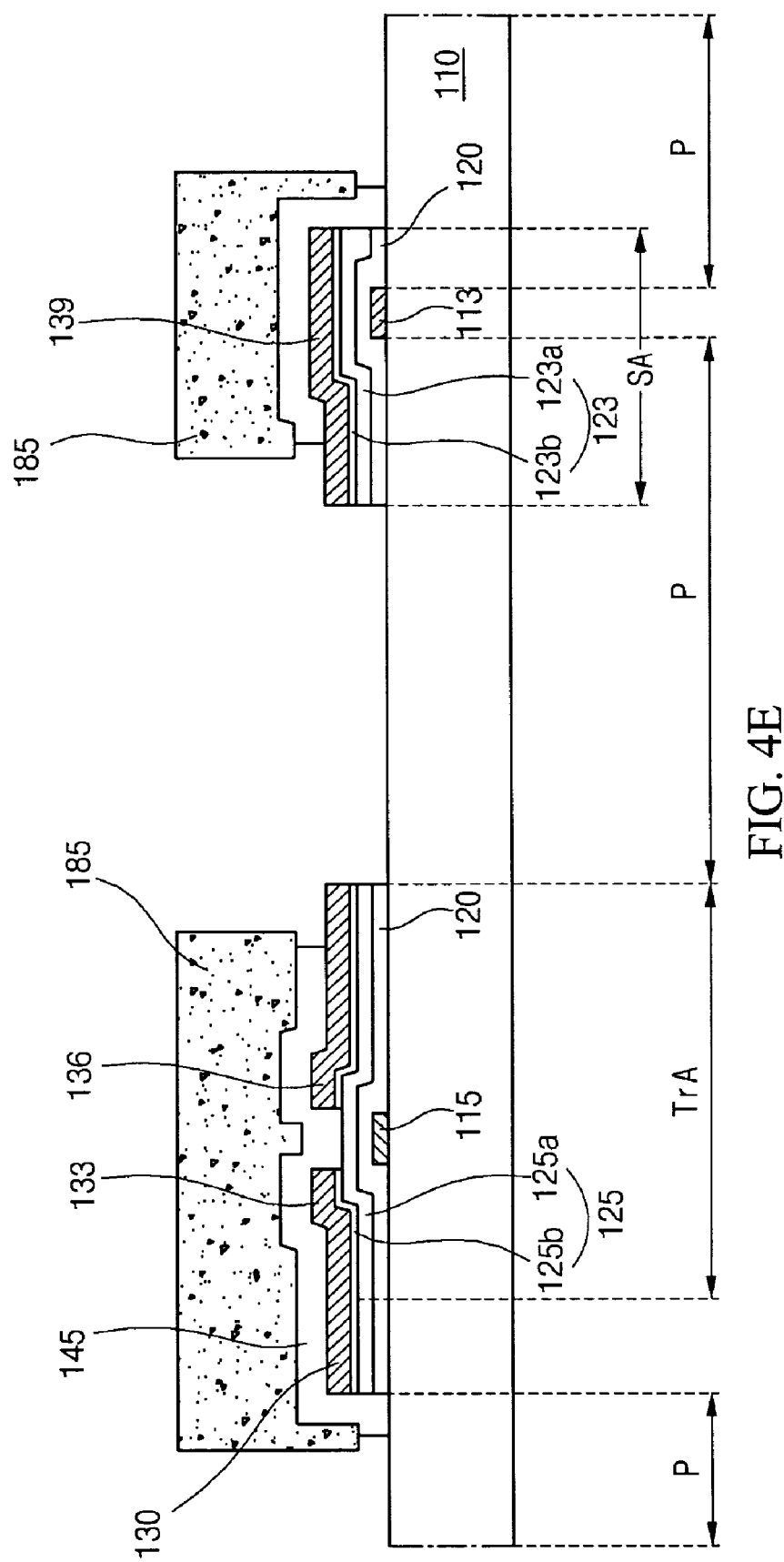

As shown in FIG. 4E to FIG. 4H, a third mask process is carried out. An insulating layer is formed on substantially an entire surface of the substrate 110 including the source and drain electrodes 133 and 136, the data line 130 and the storage electrode 139 by depositing an inorganic insulating material such as silicon oxide ($SiO_2$) or silicon nitride ($SiN_x$). A third photoresist layer is formed on the insulating layer by coating photoresist, and a mask including a transmitting portion and a blocking portion is disposed over the third photoresist layer. As shown in FIG. 4E, the third photoresist layer is exposed to light through the mask and is developed to thereby form a third photoresist pattern 185. The third photoresist pattern 185 corresponds to the switching region TrA and the storage region SA. More particularly, the third photoresist pattern 185 corresponds the gate line 113, the data line 130, the source and drain electrodes 133 and 136, and the storage electrode 139.

The insulating layer is etched by using the third photoresist pattern 185 as an etching mask to thereby form a passivation layer 145. Here, the passivation layer 145 is over-etched, and an under cut structure is formed around edges of the passivation layer 145 and the third photoresist pattern 185. The passivation layer 145 covers the gate line 113, the data line 130, the source and drain electrodes 133 and 136, and the storage electrode 139 and exposes a part of the substrate 110 in the pixel region P and parts of the drain electrode 136 and the storage electrode 139.

In FIG. 4F, a transparent conductive layer 150 is formed on substantially the entire surface of the substrate 110 including the passivation layer 145 and the third photoresist pattern 185 by depositing a transparent conductive material such as indium tin oxide (ITO) and indium zinc oxide (IZO). The transparent conductive layer 150 is disconnected around the edges of the passivation layer 145 and the third photoresist pattern 185 due to the under cut structure. A portion of the transparent conductive layer 150 in the pixel region P contacts the exposed substrate 110, the exposed parts of the drain electrode 136 and the storage electrode 139.

Figure 4G:
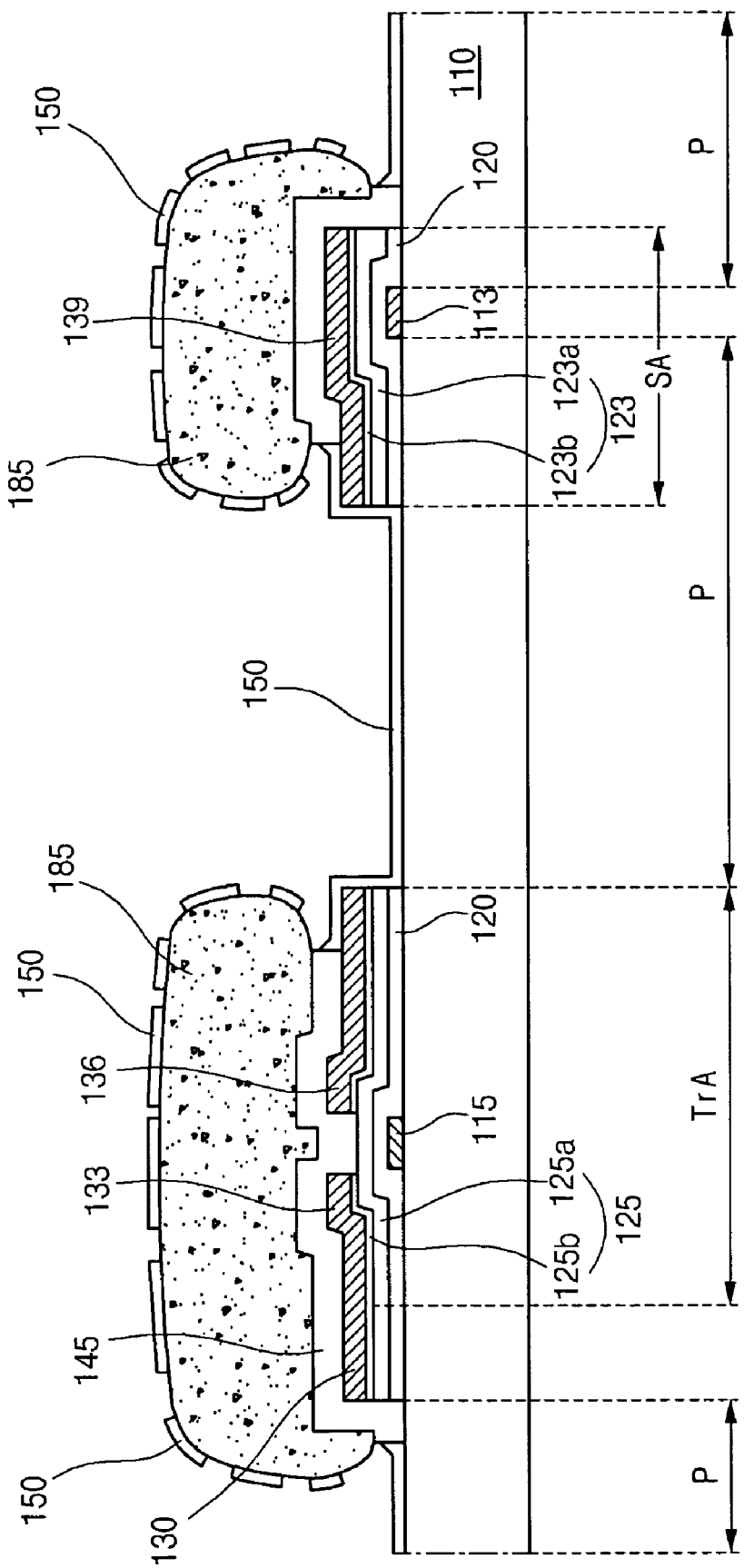

As shown, in FIG. 4G, the substrate 110 including the transparent conductive layer 150 is heat-treated on a hot plate or in a furnace at a temperature of about 100° C. to about 300° C. for about 60 seconds to about 150 seconds. At this time, the third photoresist pattern 185 expands and has a different coefficient of thermal expansion than the transparent conductive layer 150. A portion of the transparent conductive layer 150 on the third photoresist pattern 185 loses a bonding strength and cracks due to the weakened bonding strength. The third photoresist pattern 185 expands under the high temperatures, and many cracks exposing the third photoresist pattern 185 are formed in the portion of the transparent conductive layer 150 on the third photoresist pattern 185. In addition, the edge of the third photoresist pattern 185 around the under cut structure expands, and more portions of the third photoresist pattern 185 are exposed. Therefore, a stripper material can easily permeate into the third photoresist pattern 185 and an interface between the passivation layer 145 and the third photoresist pattern 185.

Figure 4H:
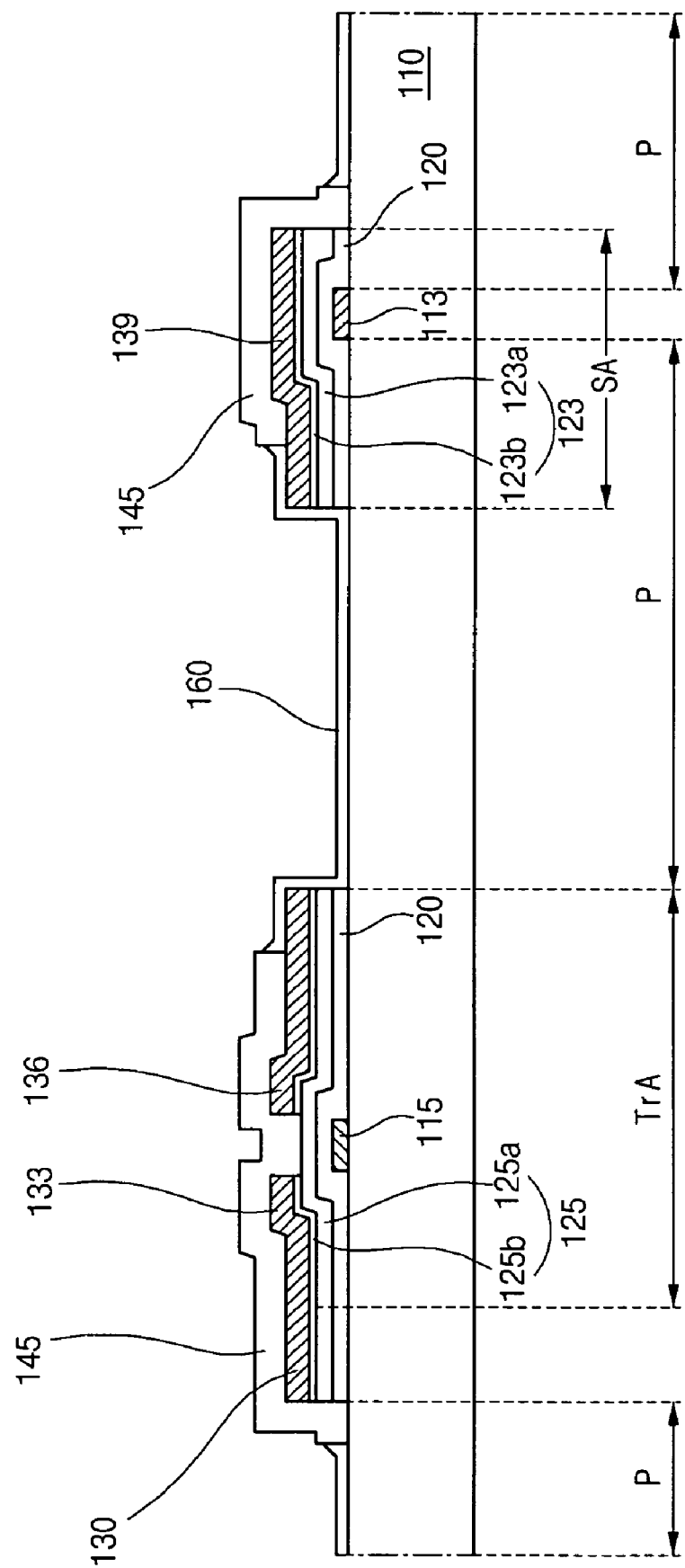

In FIG. 4H, the heat-treated substrate 110 including the third photoresist pattern 185 of FIG. 4G and the transparent conductive layer 150 is exposed to a stripper, and thus the third photoresist pattern 185 of FIG. 4G and the portion of the transparent conductive layer 150 of FIG. 4G on the third photoresist pattern 185 of FIG. 4G are removed by a lift-off method. The portion of the transparent conductive layer 150 of FIG. 4G in the pixel region P functions as a pixel electrode 160. The pixel electrode 160 contacts the exposed parts of the drain electrode 136 and the storage electrode 139 and also contacts the exposed substrate 110.

The heat-treated substrate 110 including the third photoresist pattern 185 of FIG. 4G and the transparent conductive layer 150, is exposed to the stripper for about 2 minutes to about 4 minutes. Although the time for the stripping process is about 2 minutes to about 4 minutes, the third photoresist pattern 185 and the portion of the transparent conductive layer 150 on the third photoresist pattern 185 are completely removed, since the third photoresist pattern 185 exposed to the stripper through the cracks in the portion of the transparent conductive layer 150 on the third photoresist pattern 185.

Since the time of the heat-treating process may be about 60 seconds to about 150 and the time of the stripping process may be about 2 minutes to about 4 minutes, a total time for the lift-off method may be less than 6 minutes and 30 seconds. On the other hand, in the related art, the time for the stripping process is more than 8 minutes. Accordingly, the manufacturing time is decreased, and the productivity is improved. Moreover, there is less possibility of damages to the electrodes because the electrodes are less exposed to the stripper.

Figure 5:
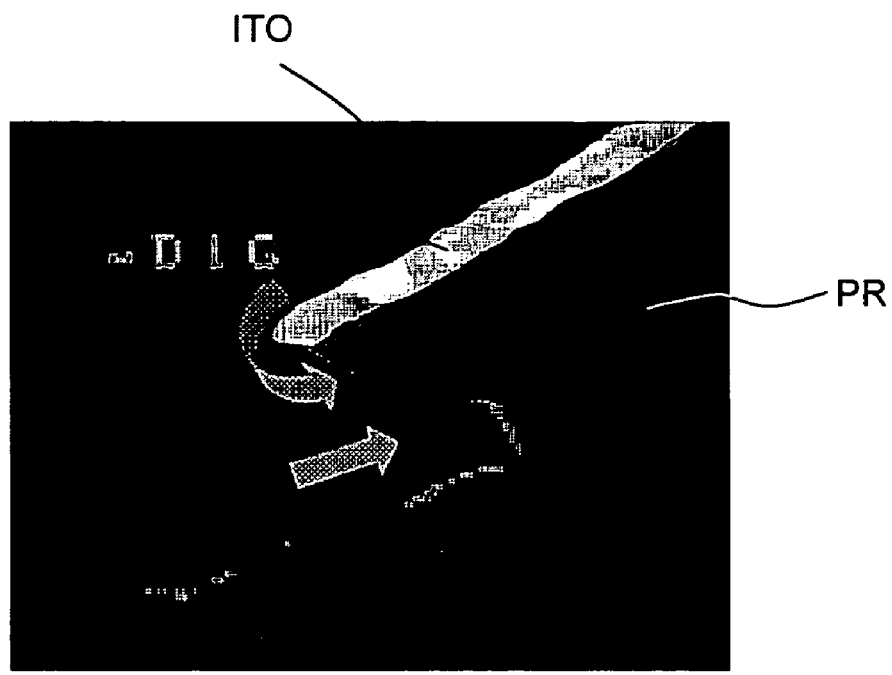
FIG. 5 is a scanning electron microscope (SEM) picture showing an edge of a photoresist pattern for a lift-off method before a heat-treating process.
Figure 6A:
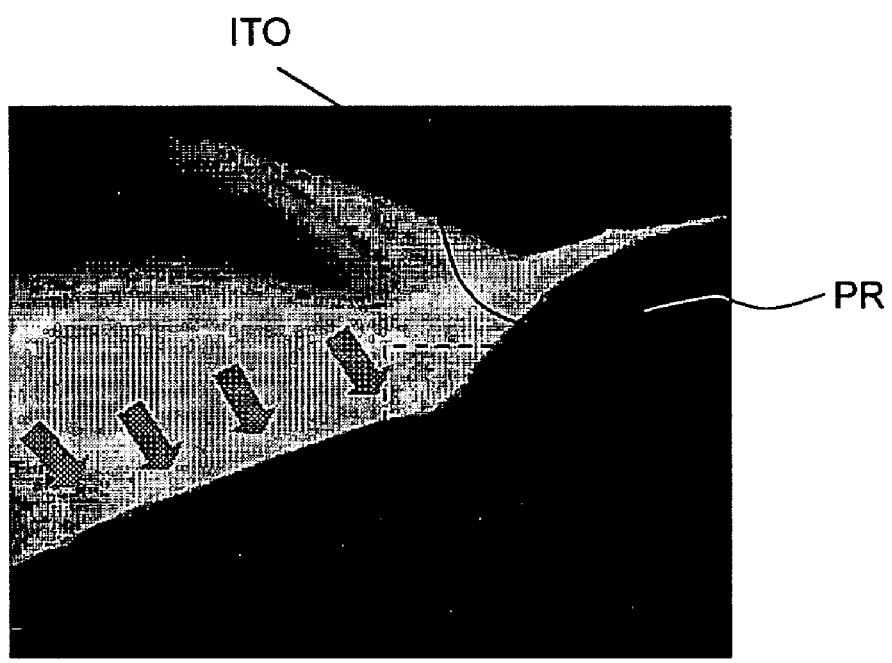
FIG. 6A and FIG. 6B are scanning electron microscope (SEM) pictures showing the edge of the photoresist pattern for the lift-off method after the heat-treating process.
Figure 6B:
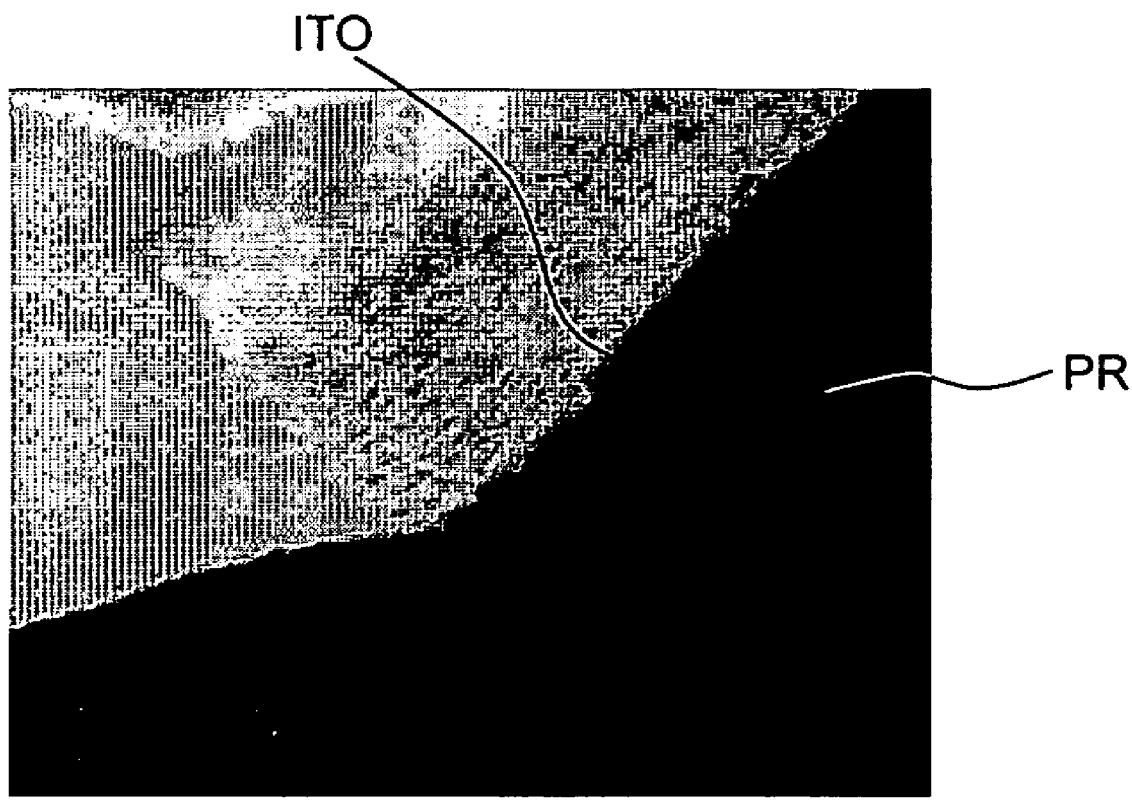

FIG. 5 is a scanning electron microscope (SEM) picture showing an edge of a photoresist pattern for a lift-off method before a heat-treating process according to the present invention, and FIG. 6A and FIG. 6B are scanning electron microscope (SEM) pictures showing the edge of the photoresist pattern for the lift-off method after the heat-treating process. FIG. 6B is an enlarged view of area A of FIG. 6A.

In the arrangement of FIG. 5, a stripper can penetrate into the photoresist pattern PR only through a portion of the photoresist pattern PR uncovered by a transparent conductive layer, for example, indium tin oxide (ITO), around an under cut structure before the heat-treating process. In FIG. 6A and FIG. 6B, the photoresist pattern PR expands after the heat-treating process and is more exposed. Accordingly, when the photoresist pattern PR is exposed to the stripper material due to, for example, cracking of the transparent conductive layer, the photoresist pattern PR contacts the stripper at more areas, and the photoresist pattern PR reacts faster with the stripper material.

In a lift-off method, a photoresist pattern is removed after the photoresist pattern expands through a heat-treating process. Accordingly, the manufacturing time is reduced, and the productivity is improved. In addition, portions of the photoresist pattern are more exposed to a stripper, and the photoresist pattern is substantially completely removed. Moreover, since an array substrate may be manufactured through three-mask processes using the lift-off method, a processing efficiency is increased, and manufacturing costs are decreased.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method of manufacturing an array substrate, the method comprising:
   using a first and a second mask, performing:
   forming a gate electrode and a gate line on a substrate;
   forming a gate insulating layer on the gate electrode and the gate line;
   forming an active layer and an ohmic contact layer on the gate insulating layer;
   forming source and drain electrodes on the ohmic contact layer and a data line on the gate insulating layer, the data line crossing the gate line to define a pixel region;
   using a third mask, performing:
   forming an insulating layer on substantially an entire surface of the substrate including the source and drain electrodes and the data line;
   forming a photoresist pattern having an angled corner on the insulating layer;
   forming a passivation layer by selectively removing the insulating layer using the photoresist pattern as an etching mask;
   forming a first transparent conductive layer on the photoresist pattern and a second transparent conductive layer on a remaining surface of the substrate, wherein the first transparent conductive layer and the second transparent conductive layer are electrically disconnected from each other;
   heat-treating the substrate including the first transparent conductive layer having the photoresist pattern underlying and the second transparent conductive layer on the remaining surface of the substrate, wherein the photoresist pattern forms a rounded corner after heat treating; and
   forming a pixel electrode by removing the photoresist pattern and the first transparent conductive layer on the photoresist pattern, wherein the photoresist pattern is deformed by a thermal expansion due to the heat-treating, and cracks are formed in the first transparent conductive layer,
   and wherein the photoresist pattern and the first transparent conductive layer on the photoresist pattern are removed by exposing the heat-treated substrate to a stripper material,
   and wherein the photoresist pattern is exposed through the cracks, and the stripper material permeates into the photoresist pattern through the cracks,
   and wherein the insulating layer is over-etched, and surrounding edges of the passivation layer are disposed inside surrounding edges of the photoresist pattern,
   and wherein the second transparent conductive layer is disconnected from the first transparent conductive layer around the surrounding edges of the passivation layer and the surrounding edges of the photoresist pattern, and wherein forming the gate insulating layer includes patterning the gate insulating layer;
   and wherein patterning the gate insulating layer, forming the active layer and the ohmic contact layer, and forming the source and drain electrodes are performed through a same mask process as one another using the first and second masks.

2. The method according to claim 1, wherein forming the passivation layer includes removing the insulating layer to expose a part of the drain electrode and the gate insulating layer in the pixel region.

3. The method according to claim 2, wherein forming the passivation layer further includes removing the gate insulating layer in the pixel region to expose the substrate in the pixel region.

4. The method according to claim 3, wherein the pixel electrode contacts the exposed substrate in the pixel region.

5. The method according to claim 1, wherein heat-treating the substrate is performed under temperatures of about 100° C. to about 300° C. for about 60 seconds to about 150 seconds.

6. The method according to claim 1, wherein heat-treating the substrate uses a hot plate or a furnace.

7. The method according to claim 1, wherein the photoresist pattern and the first transparent conductive layer have differing coefficients of thermal expansion and, by heat treating the substrate, the cracks are formed in the first transparent conductive layer on the photoresist pattern to expose the photoresist pattern through the cracks.

8. The method according to claim 1, wherein forming the source and drain electrodes and the data line includes forming a storage electrode over the gate line.

9. The method according to claim 8, wherein the storage electrode contacts the pixel electrode.

10. The method according to claim 1, wherein the transparent conductive layer comprises indium tin oxide (ITO).

* * * * *